United States Patent [19]
Picoli et al.

[11] Patent Number: 5,539,542
[45] Date of Patent: Jul. 23, 1996

[54] PHOTOREFRACTIVE DEVICE HAVING AN ELECTRO-OPTICAL MATERIAL BETWEEN TWO PHOTOCONDUCTIVE MATERIALS

[75] Inventors: Gilbert Picoli; Philippe Gravey; Jean-Emmanuel Viallet, all of Lannion, France

[73] Assignee: France Telecom, Paris, France

[21] Appl. No.: 971,966

[22] PCT Filed: Jun. 18, 1992

[86] PCT No.: PCT/FR92/00554
  § 371 Date: Feb. 18, 1993
  § 102(e) Date: Feb. 18, 1993

[87] PCT Pub. No.: WO92/22847
  PCT Pub. Date: Dec. 23, 1992

[30] Foreign Application Priority Data

Jun. 19, 1991 [FR] France .................. 91 07528

[51] Int. Cl.$^6$ .................................................. G03H 1/02
[52] U.S. Cl. ................... 359/6; 359/3; 359/7; 359/248
[58] Field of Search ......................... 359/7, 3, 4, 6, 359/248; 257/21

[56] References Cited

U.S. PATENT DOCUMENTS

| | | | |
|---|---|---|---|
| 4,037,932 | 7/1977 | Haas et al. | |
| 4,525,687 | 6/1985 | Chemla et al. | |
| 5,004,325 | 4/1991 | Glass et al. | 359/107 |
| 5,222,071 | 6/1993 | Pezeshki et al. | 257/21 |

FOREIGN PATENT DOCUMENTS

| | | |
|---|---|---|
| 2713718 | 11/1977 | Germany . |
| 8403397 | 8/1984 | WIPO . |

OTHER PUBLICATIONS

Journal of the Optical Society of America B., vol. 7, No. 11, Nov. 1990, New York, pp. 2217–2225; D. D. Nolte et al.: "Resonant photodiffractive effect in semi–insulating multiple quantum wells".

Primary Examiner—Georgia Y. Epps
Assistant Examiner—Michael A. Papalas
Attorney, Agent, or Firm—Pearne, Gordon, McCoy & Granger

[57] ABSTRACT

A photorefractive apparatus is exposed to a write beam or radiation for creating a system of interference fringes in the apparatus, as well as to a read beam or radiation which diffracts the system created and includes at least one elementary pattern (1) having an electrooptical material (6) with a high electrooptical coefficient with respect to the read radiation, which is transparent to the read radiation and which is surrounded by photoconductive materials (2, 4). The photoconductive materials are transparent to the read radiation and under the effect of the write radiation are able to respectively produce electrons and holes having a high mobility. Application to the optical processing of signals.

17 Claims, 2 Drawing Sheets

PHOTOREFRACTIVE DEVICE HAVING AN ELECTRO-OPTICAL MATERIAL BETWEEN TWO PHOTOCONDUCTIVE MATERIALS

BACKGROUND OF THE INVENTION

The present invention relates to a photorefractive apparatus, i.e. an apparatus where a photorefractive effect is liable to occur.

Explanations of the photorefractive effect are provided in:

(1) Photorefractive effect, David Pepper, Jack Feinberg, Nicolai Kukhtarev, For the Science, No. 158, December 1990, pages 58 to 64.

Reference should also be made to:

(2) Topics in Applied Physics, Springer Verlag, Vol. 61, Photorefractive materials and their applications, Volume 1, Chapter 8, The Photorefractive Effect in Semiconductors, Alastair M. Glass and Jefferson Strait.

The apparatus according to the invention can be used as a rewritable holographic recording apparatus.

As a function of the components of the apparatus according to the invention, said rewritable holographic recording apparatus can be sensitive in the visible range or in the near infrared range.

The present invention has, inter alia, as applications all those of a rewritable holographic recording apparatus and in particular the deflection of light beams, the formation of reconfigurable optical interconnections, the production of phase conjugation mirrors and the provision of signal optical treatment or processing devices, which can be of an analog or digital nature.

In the case of analog signals, the present invention e.g. applies to the production of optical correlation devices and in the case of digital signals to the production of arrays of optical logic gates.

For some years now, photorefractive materials have constituted the most widely investigated class of rewritable holographic recording apparatuses for all dynamic holography applications.

The principle of the photorefractive effect is as follows. The charge carriers are photoexcited under the effect of a non-homogeneous illumination such as an interference pattern and are non-homogeneously redistributed, thus creating a space charge field. The latter induces by the electrooptical effect a variation of the refractive index, which is the "image", apart from a possible spatial displacement, of the initial interference pattern. The two fundamental elements of the photorefractive effect are consequently photoconductivity and the electrooptical effect.

Most frequently, the electrooptical effect is the Pockels effect and it is then necessary to use photorefractive materials in the form of solid monocrystals, which can be in the form of a parallelepiped, whereof each of the edges is a few millimeters.

Compared with several other non-linear optical effects, the photorefractive effect has an original characteristic. Thus, it is sensitive to light energy per surface unit and not to the light intensity of the write radiation.

This is due to the integration effect inherent in the formation of the space charge field, the number of displaced charges per time unit being proportional to the photon flux.

Thus, the variation of the refractive index dN increases, in a time called the response time and which is designated "tau", which is inversely proportional to the incident light intensity until it reaches a limit value dNmax.

Known photorefractive materials can be classified in two categories from the performance standpoint:

slow materials having a significant effect on saturation, such as $LiNbO_3$, $BaTiO_3$, $KNbO_3$, $(BaSr)Nb_2O_6$ (SBN), fast materials having a limited effect on saturation, such as sillenites ($Bi_{12}SiO_{20}$, $Bi_{12}GeO_{20}$, $Bi_{12}TiO_{20}$) and semiconductors (GaAs, InP, CdTe, GAP).

When account is taken of the refractive index variation per light intensity unit dN/I, which is a function of the figure of merit $N^3 \cdot r/eps$ (in which I,N,r and eps respectively represent the intensity of the write radiation, the refractive index of the material, the effective linear electrooptical coefficient of the material and the dielectric constant of said material), it can be seen that all known solid photorefractive materials have identical characteristics to within a factor of 10.

The interest of the materials GaAs, InP and CdTe is of having a significant sensitivity to the wavelengths used in the field of optical telecommunications.

However, the known photorefractive materials suffer from a disadvantage. It is not possible to find materials which simultaneously have a short response time to optical excitation and a high refractive index variation dN.

Various solutions have been tried for solving this problem.

1. Application of an electric field for increasing the space charge field.

This has been successful with sillenites and semiconductors. However, it leads to a certain increase (10 to 100) of the time constant compared with operation in a zero field and particularly leads to the appearance of a photocurrent, as a result of the application of an electric field, limits the maximum intensity which can be withstood by the photorefractive crystal and therefore the response time cannot be made as short as when no field is applied.

2. Application of an electric field for increasing the effective electrooptical coefficient.

If the use wavelength is close to that corresponding to the width of the forbidden band of the material, the electrorefraction (Franz-Keldysh effect) becomes high and can lead to an effective electrooptical coefficient (proportional to the field) which is several times higher than the linear electrooptical coefficient.

This resonant effect (unlike the standard photorefractive effect), combined with the space charge field increase effect, makes it possible to achieve the highest limit values dNmax in solid semiconductors.

However, the "speed" limitations due to the photocurrent remain the same as in the case referred to in 1, i.e. the response time to an optical excitation remains relatively high.

3. The use of a multiple quantum well structure.

It is known that the electrorefraction effect can be significantly increased on passing from a solid material to a multiple quantum well structure. This has applications in the field of light modulation in guided configuration or perpendicular to the substrate. Reference can be made to the following document in this connection:

(3) Resonant photodiffractive effect in semiinsulating multiple quantum wells, D. D. Nolte, D. H. Olson, G. E. Doran, W. H. Knox and A. M. Glass, J. Opt. Soc. Am.B, Vol. 7, No. 11, November 1990, pages 2217 to 2225.

In connection with the photorefractive effect, document (3) has demonstrated the possibility of obtaining significant diffraction efficiencies (through 1 micrometer of active material). The method proposed in (3) consists of making semiinsulating a GaAs/AlGaAs multiple quantum well structure by introducing protons.

Compared with the methods described hereinbefore, the electric field is only used for increasing the effective electrooptical coefficient and not for a contribution to the displacement of the charges in the multiple quantum well structure. Therefore, the advantages of the method described in (1) are lost, but it is possible to use short response times.

Another interest of the multiple quantum well structure compared with a solid structure is the possibility of adjusting the operating wavelength for a given application.

However, the diffraction efficiencies obtained with the method described in (3) are approximately $10^{-5}$ and are therefore too low for the applications envisaged hereinbefore in connection with rewritable holographic recording apparatuses.

In order to obviate this disadvantage, one possible solution consists of increasing the thickness of the active material but, in this case, the growth method and more particularly the implantation method are unsuitable and it is therefore necessary to seek an optimized multiple quantum well structure for these electrooptical effects and containing a deep center with an energy level and a concentration which are carefully chosen, which can make optimization difficult.

Thus, with known photorefractive materials, it is impossible to simultaneously have a high speed for establishing the refractive index system, said speed being more particularly linked with the mobility mu of the charge carriers and a high amplitude for the photoinduced index system, said amplitude being linked with the electrooptical figure of merit value $N^3 \cdot r/2$.

Thus, the fastest of the known materials is InP:Fe (mu approximately 3000 cm$^2$/V·s) and systems can be recorded by the photorefractive effect in semiconductors such as GaAs, InP and CdTe in a few dozen picoseconds with luminous fluxes of approximately 1 mJ/cm$^2$ at 1.06 micrometer. However, the figure of merit of InP is only 25 pm/V.

Conversely, certain materials having a perovskite structure have a figure of merit of approximately 1000 pm/V but with mobilities well below 0.1 cm$^2$/V·s.

It is hardly likely that it will be possible to find a photorefractive material simultaneously having the necessary speed and high amplitude referred to hereinbefore.

In the field of low light intensities (approximately 10 mW/cm$^2$), which are e.g. supplied by diode-pumped Nd:YAG lasers, it is possible to apply a continuous electric field of approximately 10 kV/cm to InP in order to partly compensate the weakness of the electrooptical coefficient (the response times are under these conditions approximately 50 to 100 ms), but the current increase in the presence of high intensities required for lowering the response time, although only 1 microsecond, makes it impossible to use this process in the case of high light intensities.

SUMMARY OF THE INVENTION

The present invention solves the problem of finding a photorefractive structure or apparatus having both a high speed of establishing the refractive index system therein during an appropriate optical excitation, i.e. a short response time to said excitation and a high amplitude of said index system, i.e. a large index variation.

The present invention therefore relates to a photorefractive apparatus for exposure to a write radiation for creating a system of interference fringes in the apparatus and to a read radiation which diffracts the system created, characterized in that it comprises at least one elementary pattern, each elementary pattern having an electrooptical material at a high electrooptical coefficient compared with the read radiation and which is transparent to the latter and a first photoconductive material and a second photoconductive material, which surround the electrooptical material and which are transparent to the read radiation and which, under the effect of the write radiation, are able to respectively produce electrons having a high mobility and holes having a high mobility.

Thus, by illuminating one face of the apparatus with the write beam, a periodic electric field is created in the first and second photoconductive materials and said field induces a refractive index variation in the electrooptical material of the apparatus.

The term high electrooptical coefficient is understood to mean an electrooptical coefficient at least equal to 500 pm/V. The term "high mobility" means a mobility of at least 10 cm$^2$/V·s.

According to a special embodiment of the apparatus according to the invention, the first photoconductive material is a semiconductor transparent to the read radiation and having in its forbidden band, a partly occupied energy level which, under the effect of the write radiation, mainly emits electrons, having a high mobility, towards the conduction band of said semiconductor (type n photoconductor), and the second photoconductive material is a semiconductor transparent to the read radiation and having, in its forbidden band, a partly occupied energy level which, under the effect of the write radiation, mainly emits holes, having a high mobility, towards the valence band of the semiconductor constituting the second photoconductive material (type p photoconductor).

Preferably, the energy levels respectively corresponding to the first and second photoconductive materials are deep levels. The apparatus is then easier to use with low exciting light intensities.

In a special embodiment, the first and second photoconductive materials are made from a same semiconductor material with different dopings making the first photoconductive material of type n and the second photoconductive material of type p.

Preferably, the thickness of the electrooptical material is of the same order of magnitude as the spacing of the interference fringes. This thickness can be approximately 0.5 to 1.

The electrooptical material can have a multiple quantum well structure.

As a variant, the electrooptical material can be in the form of a single layer.

The apparatus according to the invention can comprise a plurality of elementary patterns.

Finally, each elementary pattern is preferably separated from an adjacent elementary pattern by an insulating layer, which is transparent to the read radiation and which constitutes an electrical screen between the respective photoconductive materials of said elementary patterns.

BRIEF DESCRIPTION OF THE DRAWINGS

The invention is described in greater detail hereinafter relative to non-limitative embodiments and with reference to the attached drawings, wherein.

DETAILED DESCRIPTION OF THE PREFERRED EMBODIMENTS

Figure 1:
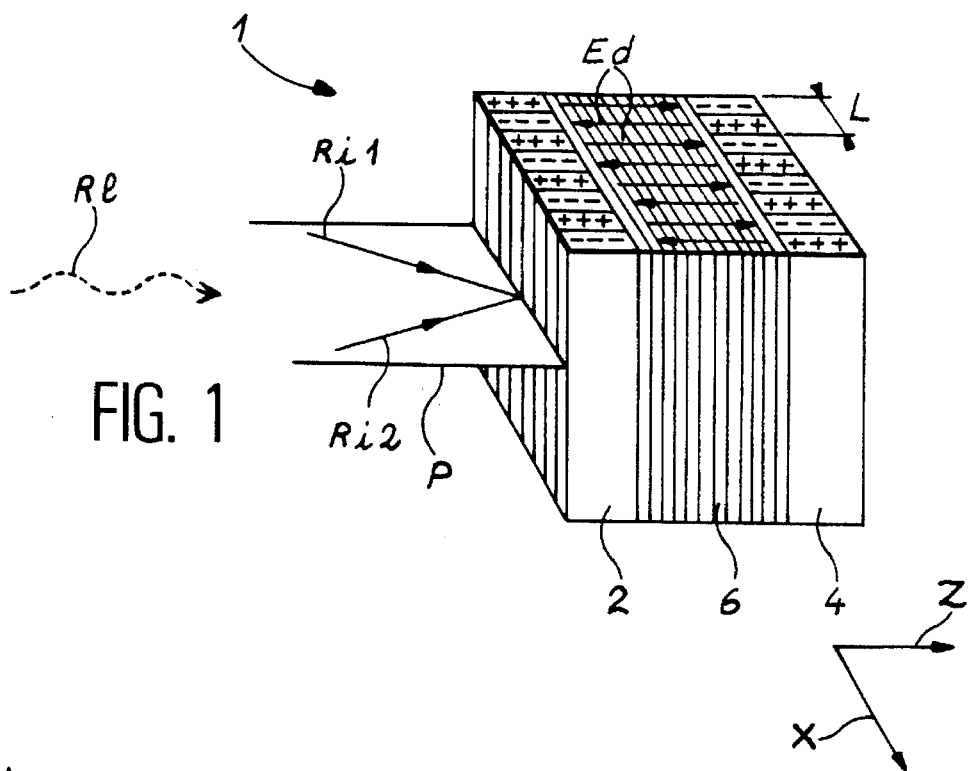
FIG. 1 is a diagrammatic view of an apparatus according to the invention having a single elementary pattern and whose electrooptical material has a multiple quantum well structure.

The apparatus according to the invention diagrammatically shown in FIG. 1 has a single elementary pattern 1. During its use, it is exposed to a write radiation or to an exciting radiation, which creates a system of interference fringes in the apparatus and whereof it is possible to see the two interfering write radiations Ri1 and Ri2.

When the apparatus is exposed to the write radiation or following said exposure, a read radiation R1 or use radiation is supplied to the apparatus.

The elementary pattern 1 has two photoconductive layers 2, 4 and an electrooptical multi layer 6 having a multiple quantum well structure and which is positioned between the two photoconductive layers 2, 4. The multilayer 6 has a high electrooptical coefficient with respect to the read beam and is transparent to the latter. The layers 2, 4 are semiconductor layers, whose respective majority carriers have a high mobility and which are transparent to the read radiation.

The semiconductor material of the layer 2 is a type n photoconductor and more specifically has in its forbidden band a deep energy level which is partly occupied and which, under the effect of the write radiation, mainly emits electrons to the conduction band of said semiconductor material.

Figure 2:
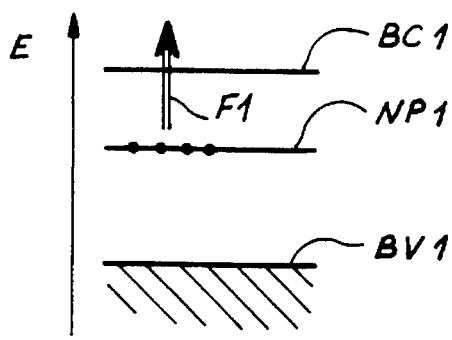
FIG. 2 diagrammatically shows an electron emission to the conduction band of the semiconductor material constituting the first photoconductive material of the apparatus of FIG. 1.

This is diagrammatically illustrated in FIG. 2, in which BV1, BC1 and NP1 respectively represent the valence band, the conduction band and the deep level relative to the semiconductor layer 2, the arrow F1 symbolizing the electron emission from the deep level NP1 to the conduction band BC1. In conventional manner, the axis E represents the axis of the electronic energies.

The semiconductor material of the layer 4 is a type p photoconductor and more specifically has in its forbidden band a deep energy level, which is partly occupied and which, under the effect of the write radiation, mainly emits holes towards the valence band of said semiconductor material of layer 4.

Figure 3:
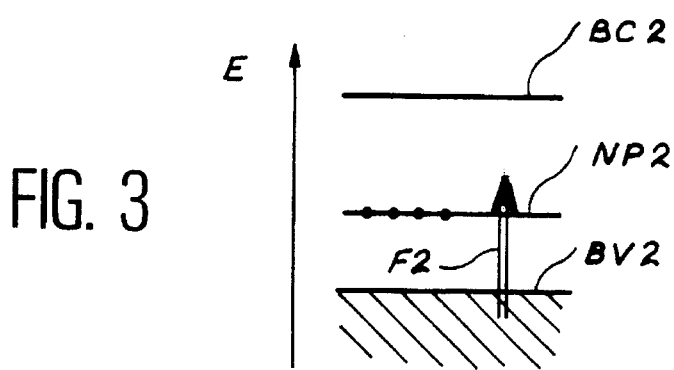
FIG. 3 diagrammatically shows an emission of holes to the valence band of the semiconductor material constituting the second photoconductive material of the apparatus of FIG. 1.

This is diagrammatically illustrated in FIG. 3, in which BV2, BC2 and NP2 respectively represent the valence band, the conduction band and the deep level of the semiconductor material of the layer 4.

The arrow F2 in FIG. 3 symbolizes the passage of electrons from the valence band BV2 to the level NP2 (i.e. the emission of holes from the deep level NP2 to the valence band BV2) under the effect of the exciting radiation or beam.

During the use of the apparatus of FIG. 1, onto one of the layers 2 and 4 (layer 2 in the case of FIG. 1) and parallel to a plane P perpendicular to said layer, are supplied the two write radiation beams Ri1 and Ri2. These two radiation beams interfere in the apparatus and more specifically create an interference pattern in each of the layers 2, 4.

Moreover, it is general practice to operate in transmission and the not shown substrate on which are stacked the layers 2, 4 and 6 is then chosen so as to be transparent to the read radiation.

In addition, the multilayer 6 having a multiple quantum well structure, reverse polarization takes place of the apparatus of FIG. 1, the layer 2 being brought to a negative potential compared with the layer 4.

In FIG. 1, the strata shown in both layers 2 and 4 symbolize the interference pattern formed. In FIG. 1, the symbols +++ and —— symbolize the redistribution of charges as a result of the formation of said interference pattern. Thus, for each of the layers 2 and 4, the adjacent strata are allocated with opposite charges and two strata respectively belonging to the layers 2 and 4 and facing one another carry opposite charges.

As a result of the creation of the interference pattern, whose spacing is designated L, the electrooptical material constituted by the multilayer 6 is subject to a periodic electric field along an axis Z perpendicular to the layers 2 and 4, said field also being periodic along the axis X, which is perpendicular to the axis Z and parallel to the plane P.

The amplitude of the electric field is approximately equal to:

$$Ed=(2pi/L)\cdot(k\cdot T/e)$$

in which pi, k, T and e respectively represent the number equalling approximately 3.14, the Boltzmann constant, the temperature of the apparatus and the electron charge (the systems of electrical charges induced in the layers 2 and 4 are, by design, in phase opposition).

These considerations apply if the thickness of the multilayer 6 is of the same order of magnitude as the spacing of the interference fringes and which is e.g. approximately 1 micrometer.

Thus, when the spacing L of the interference fringes is approximately 1 micrometer, it is possible to choose a thickness of approximately 1 micrometer for the multilayer 6.

By repeating the elementary pattern of FIG. 1 about 100 times, a satisfactory interaction length is then obtained of approximately 100 micrometers.

The present invention and in particular the apparatus shown in FIG. 1, differs from the structure proposed in document (3) by a separation of the photoconduction and electrooptical functions, which leads to a better overall optimization.

Moreover, the thickness increase of the apparatus, by stacking several elementary patterns, is relatively easier than a thickness increase of the structure as proposed in (3), as a result of the lack of need to install deep centers by proton bombardment.

The multilayer 6 forming the electrooptical material of the apparatus of FIG. 1 is e.g. the multiple quantum well structure resulting from the stacking of 15 patterns InGaAsP/InP 7 nm/25 nm (whose total thickness is 1.3 micrometre).

It is known from the following document:

(4) "Quaternary quantum wells for electrooptic intensity and phase modulation at 1.3 and 1.55 micrometer" J. E.

Zucker, I. Bar-Joseph, N. I. Miller, V. Koren and D. S. Chemla, Applied Physics Letters, Vol. 54, No. 1, January 1989, pp. 10 to 12.

That the said multiple quantum well structure has an electrooptical figure of merit comparable to BaTiO$_3$ when working at a wavelength corresponding to the exciton resonance and by applying an electrical field of 100 kV/cm a value of 800 pm/V was obtained in the vicinity of 1.3 micrometers.

Three examples are given below for the layers 2 (n type doping) and 4 (p type doping):

(a) layer 2 of InP:Ti and layer 4 of InP:Fe, (b) layer 2 of InP:Fe (with a high concentration of |Fe$^{++}$| and F$^{++}$ and layer 4 of InP:Fe, (c) layer 2 of InP:Cr (donor) and layer 4 of InP:Cr (acceptor).

Thus, it is possible to use the same semiconductor material with different doping types for producing the layers 2 and 4.

It is also possible to use two different semiconductor materials, one with a n type doping for producing the layer 2 and the other with a p type doping for producing the layer 4.

Figure 4:
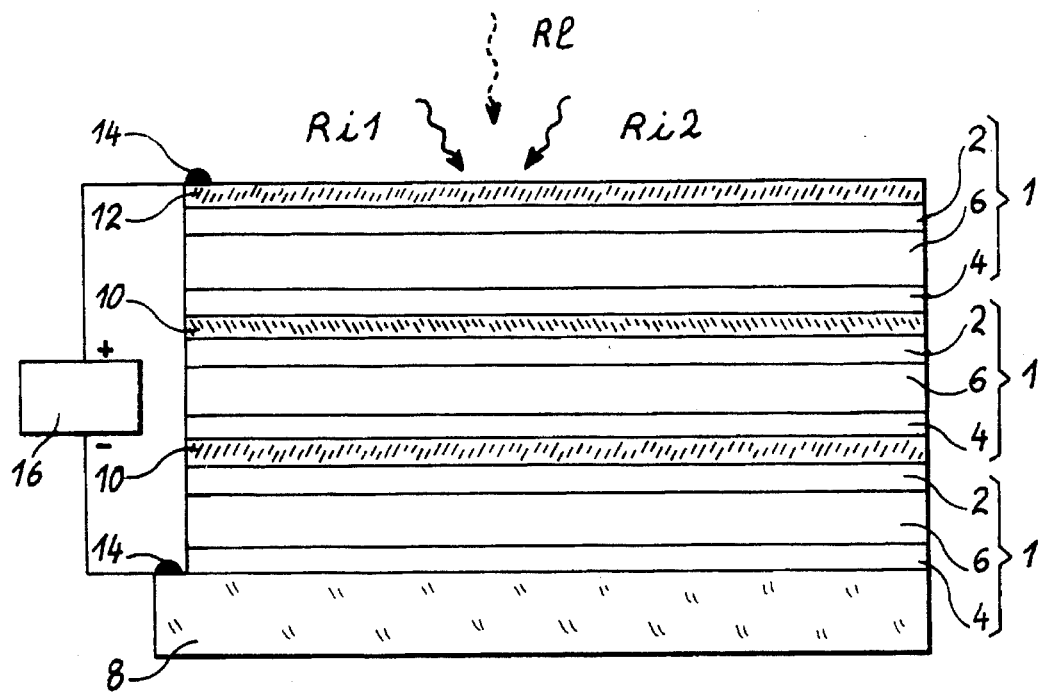
FIG. 4 diagrammatically shows an apparatus according to the invention having a plurality of elementary patterns, each of the latter incorporating an electrooptical material having a multiple quantum well structure.

FIG. 4 diagrammatically shows an apparatus according to the invention having a plurality of elementary patterns of the type shown in FIG. 1. More specifically, the apparatus of FIG. 4 comprises, on a substrate 8, a plurality of elementary "layer 4-multilayer 6-layer 2" patterns stacked on one another, so that a layer 4 is in contact with the substrate 8.

Preferably, each elementary pattern is separated from the following pattern by a layer 10 transparent to the read radiation R1 and whose thickness is e.g. a few hundred nanometers and which forms an electrical shield between said patterns, so that the electrical field produced in the layer 2 of one elementary pattern is not compensated by the electrical field produced in the layer 4 of the adjacent elementary pattern, The apparatus of FIG. 4 also comprises a contact layer 12 covering the layer 2 furthest from the substrate 8.

FIG. 4 also shows electrical contacts 14 located on the edge of the apparatus and one of the contacts 14 is located on the contact layer 12 and the other contact 14 on an edge of the substrate 8, the apparatus being produced in such a way that said edge of the substrate 8 is not covered by the layers stacked on the substrate.

The apparatus of FIG. 4 is polarized by appropriate polarization means 16 permitting a reverse polarization thereof, the contact layer 12 being raised to a positive potential with respect to the substrate.

In a purely indicative and in no way limitative manner the substrate 8 is of n-doped InP, each layer 10 is of n$^-$-doped InP, the contact layer 12 is of p-doped InP, each layer 2 is of n-doped InP, each layer 4 is of p-doped InP and each layer 6 is an InGaAs/InP or InGaAsP/InP multiple quantum well structure.

The apparatus of FIG. 4 can optionally have another, not shown n$^+$-doped InP contact layer between substrate 8 and the layer 4 closest to the latter.

Thus, it is possible to produce an apparatus according to the invention with layers 2 and 4 made from InP and multilayer 6, which constitute multiple quantum well structures compatible with InP, e.g. InGaAsP/InP or InGaAs/InP structures.

The layers necessary for producing such apparatuses can be produced by methods known in connection with such materials.

It is in particular possible to use the MOCVD method and the MBE method with gas sources lending themselves to the production of multiple quantum well structures and InP:Fe or InP:Ti semiinsulating layers, with growth rates of several micrometers per hour.

Details are given hereinafter of the performance characteristics obtainable with apparatuses according to the invention.

1. Performance characteristics relative to the variation of the refractive index dNmax obtained with a lambda reading wavelength, the refractive index N then being in the form $$N = No + dNmax \cdot \cos(2 \, pi \cdot x/lambda)$$

Using the example of an electrooptical material having a multiple quantum well structure with a high electrooptical coefficient, it has been shown hereinbefore that the order of magnitude of the periodic component of the field applied to this material is approximately 1 kV/cm. This leads to a value of approximately $10^{-4}$ for dNmax, with electrooptical coefficients of approximately 1000 pm/V.

An evaluation of the diffraction efficiency Rd is as follows:

$$Rd = (pi \cdot Lt \cdot dNmax/lambda)^2$$

in which Lt represents the total active thickness of the apparatus. If the latter is 100 micrometers (stacks of 100 elementary patterns), the diffraction efficiency is $10^{-3}$, which is completely suitable for different applications, e.g. in the image proceessing field.

It should be noted that this estimate of the diffraction efficiency does not take account of the effect of the absorption system, which develops in addition to the refractive index system and which increases the total diffraction efficiency.

The estimate made hereinbefore assumes that the use wavelength is slightly below that associated with the gap of the electrooptical material (layer 6).

A choice of a use wavelength slightly higher than that associated with said gap is also possible and leads to at least 10 times higher dNmax values. However, in this case, it is necessary to reduce the number of elementary patterns due to the absorption.

Thus, the choice of the "use wavelength-number of elementary patterns" pair is to be optimized as a function of the characteristics of the materials, the technological possibilities and applications.

2. Performance characteristics relative to the photosensitivity dN/I.

The interest of the apparatus according to the invention, which makes it possible to separate the photoconduction function from the electrooptical function is particularly apparent on considering the photosensitivity, because the overall figure of merit $N^3 \cdot r/eps$ is well above those of the known photorefractive materials (the product $N^3 \cdot r$ here being associated with the high electtrooptical coefficient material, e.g. a material having a multiple quantum well structure and the quantity eps being associated with the photoconductive material or materials having a low dielectric constant, e.g. InP).

The order of magnitude of the photosensitivity gain (taking as a reference solid InP in non-resonant operation) ranges from 50 (for a use wavelength below that corresponding to the gap) to a few hundred (for a use wavelength just above that corresponding to the gap).

It is pointed out that the displacement of the charges in the material surrounding the multiple quantum well structure is not assisted by a continuous electrical field and that consequently the space charge field formation time constant is identical to that of a solid material operating without an applied field.

3. Performance characteristics relative to the response time tau.

It has been shown hereinbefore that an apparatus according to the invention provided a significant photosensitivity gain compared with the known photorefractive materials. This makes it possible to move back the limits which, in practise, result from the heating due to optical absorption and the Joule effect. It should also be noted that the use of thin layers is advantageous from the heat dissipation standpoint.

The use of an electrical field perpendicular to the apparatus and having a value of approximately 100 kV/cm (to be compared with the value of approximately 10 kV/cm typically used in solid photorefractive semiconductors) could give rise to the idea that serious heating problems due to the Joule effect could occur.

However, in the present invention, the situation is radically different because, apart from the fact that thin layers can be used, the intermediate electrooptical material has a higher resistivity and is not necessarily photoconductive at the use wavelength (it is in fact preferable that this is not the case).

Moreover, it is possible to use an operating method where the electrical field (used solely for obtaining a high electrooptical coefficient) is applied just after a brief, high intensity writing pulse, the intensity of the read radiation being lower.

The present invention makes it possible to obtain response times of approximately 1 ns, the light intensity necessary for reaching such values being approximately 1 to 100 kW/cm$^2$.

It is pointed out that as a result of the symmetry of revolution with respect to the perpendicular for the different layers of an apparatus according to the invention, the result obtained is independent of the polarization of the write radiations of the hologram, when said beams are polarized. Obviously, in this case, the polarizations of the write beams must be identical in order to produce an interference pattern.

In the present invention, the intermediate material with a high electrooptical coefficient does not necessarily have a multiple quantum well structure. It is possible to use a "bulk" material with a high electrooptical coefficient (e.g. approximately 10$^4$ pm/V).

In this connection, it is possible to use a ferroelectric material having a high electrooptical coefficient, e.g. BaTiO$_3$.

Figure 5:
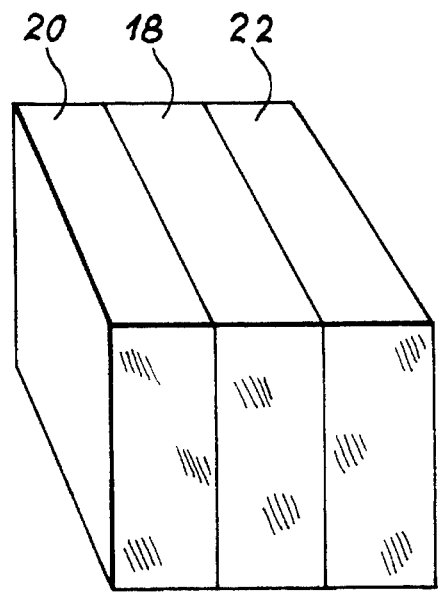
FIG. 5 diagrammatically shows another apparatus according to the invention having a single elementary pattern and whose electrooptical material is in the form of a single layer.

FIG. 5 shows an elementary pattern corresponding to this possibility. A single BaTiO$_3$ layer 18 is located between an e.g. amorphous Si photoconductive layer 20 and another e.g. amorphous Si photoconductive layer 22.

A thickness of 1 micrometer for the intermediate or active layer 18 then leads to a diffraction efficiency of approximately 10$^{-5}$.

Another apparatus according to the invention is obtained by stacking elementary patterns, of the type described relative to FIG. 5. A stack of ten elementary patterns, whereof the active layers have in each case a thickness of 1 micrometer, then leads to a diffraction efficiency of approximately 10$^{-3}$.

We claim:

1. Photorefractive apparatus which is to be exposed to a write radiation to create a system of interference fringes in the apparatus and to a read radiation which is diffracted by the created system, said apparatus comprising one elementary pattern, said elementary pattern having an electrooptical material which has a high electrooptical coefficient with respect to the read radiation and which is transparent to said read radiation and a first n-type photoconductive material and a second p-type photoconductive material which surround the electrooptical material and which are transparent to the read radiation and which, under the effect of the write radiation, are able to respectively produce electrons having a high mobility of at least 10 cm$^2$/V·S and holes having a high mobility of at least 10 cm$^2$/V·S, said electrooptical coefficient being at least equal to 500 pm/V.

2. Apparatus according to claim 1, wherein the first photoconductive material is a semiconductor transparent to the read radiation and having, in a forbidden band of said first photoconductive material, a partially occupied energy level which, under the effect of the write radiation, mainly emits electrons having a high mobility of at least 10 cm$^2$/V·S, towards the conduction band of said semiconductor, and wherein the second photoconductive material is a semiconductor transparent to the read radiation and having, in a forbidden band of said second photoconducting material, a partially occupied energy level which, under the effect of the write radiation, mainly emits holes having a high mobility of at least 10 cm$^2$V·S, towards the valence band of said semiconductor constituting the second photoconductive material.

3. Apparatus according to claim 2, wherein the energy levels corresponding respectively to the first and the second photoconductive materials are deep levels.

4. Apparatus according to claim 2, wherein the first and the second photoconductive materials are formed from the same semiconductor material, whose doping is of the n type for the first photoconductive material and of the p type for the second photoconductive material.

5. Apparatus according to claim 1, wherein the thickness of the electrooptical material is of an order of magnitude which is the same as an order of magnitude of the spacing of the interference fringes.

6. Apparatus according to claim 1, wherein the thickness of the electrooptical material is approximately 0.05 to 1 micrometre.

7. Apparatus according to claim 1, wherein the electrooptical material has a multiple quantum well structure.

8. Apparatus according to claim 1, wherein the electrooptical material is in the form of a single layer.

9. Photorefractive apparatus which is to be exposed to a write radiation to create a system of interference fringes in the apparatus and to a read radiation which is diffracted by the created system, said apparatus comprising a plurality of elementary patterns which are stacked on one another, each elementary pattern having an electrooptical material which has a high electrooptical coefficient with respect to the read radiation and which is transparent to said read radiation and a first n-type photoconductive material and a second p-type photoconductive material which surround the electrooptical material and which are transparent to the read radiation and which, under the effect of the write radiation, are able to respectively produce electrons having a high mobility of at least 10 cm$^2$/V·S and holes having a high mobility of at least 10 cm$^2$/V·S, said electrooptical coefficient being at least equal to 500 pm/V.

10. Apparatus according to claim 9, characterized in that each elementary pattern is separated from an adjacent elementary pattern by an insulating layer, said insulating layer being transparent to the read radiation and constituting an electrical screen between the respective photoconductive materials of said elementary patterns.

11. Apparatus according to claim 9, wherein the first photoconductive material is a semiconductor transparent to the read radiation and having, in a forbidden band of said first photoconductive material, a partially occupied energy level which, under the effect of the write radiation, mainly emits electrons having a high mobility of at least 10 $cm^2/V \cdot S$, towards the conduction band of said semiconductor, and wherein the second photoconductive material is a semiconductor transparent to the read radiation and having, in a forbidden band of said second photoconducting material, a partially occupied energy level which, under the effect of the write radiation, mainly emits holes having a high mobility of at least 10 $cm^2/V \cdot S$, towards the valence band of said semiconductor constituting the second photoconductive material.

12. Apparatus according to claim 11, wherein the energy levels corresponding respectively to the first and the second photoconductive materials are deep levels.

13. Apparatus according to claim 11, wherein the first and the second photoconductive materials are formed from the same semiconductor material, whose doping is of the n type for the first photoconductive material and of the p type for the second photoconductive material.

14. Apparatus according to claim 9, wherein the thickness of the electrooptical material is an order of magnitude which is the same as the order of magnitude as the spacing of the interference fringes.

15. Apparatus according to claim 9, wherein the thickness of the electrooptical material is approximately 0.05 to 1 micrometer.

16. Apparatus according to claim 9, wherein the electrooptical material has a multiple quantum well structure.

17. Apparatus according to claim 9, wherein the electrooptical material is in the form of a single layer.

* * * * *